(12) United States Patent
Park

(10) Patent No.: US 7,230,466 B2
(45) Date of Patent: Jun. 12, 2007

(54) DATA STROBE SIGNAL GENERATING CIRCUIT AND DATA STROBE SIGNAL GENERATING METHOD

(75) Inventor: Ki-Chon Park, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 18 days.

(21) Appl. No.: 11/066,010

(22) Filed: Feb. 24, 2005

(65) Prior Publication Data

US 2006/0139080 A1    Jun. 29, 2006

(30) Foreign Application Priority Data

Dec. 28, 2004   (KR) .................... 10-2004-0113555

(51) Int. Cl.
*H03K 3/017*    (2006.01)
*H03B 1/00*     (2006.01)
(52) U.S. Cl. ...................... 327/176; 327/112
(58) Field of Classification Search ............... 327/108, 327/112, 294, 298, 170, 172, 176
See application file for complete search history.

(56) References Cited

U.S. PATENT DOCUMENTS

| 6,327,196 B1 * | 12/2001 | Mullarkey ................. 365/194 |
| 6,351,172 B1 * | 2/2002 | Ouyang et al. ............ 327/333 |
| 6,940,321 B2 * | 9/2005 | Heo et al. ................. 327/112 |
| 2005/0128825 A1 * | 6/2005 | Cho ........................... 365/193 |

* cited by examiner

*Primary Examiner*—My-Trang Nu Ton
(74) *Attorney, Agent, or Firm*—Blakely Sokoloff Taylor & Zafman

(57) ABSTRACT

Provided is a data strobe signal generating circuit capable of guaranteeing a preamble time (tRPRE). The data strobe signal generating circuit includes: a strobe output driver for outputting a data strobe signal to an outside of a semiconductor device so as to indicate synchronization between an external device and data input/output; and a preamble part for maintaining an output of the strobe output driver to a predetermined logic level during a predetermined delay time from an enabling timing of the preamble signal. Accordingly, it is possible to guarantee the stable operation of the semiconductor memory even when PVT (processor, operating voltage, operating temperature) changes.

14 Claims, 6 Drawing Sheets

DATA STROBE SIGNAL GENERATING CIRCUIT AND DATA STROBE SIGNAL GENERATING METHOD

FIELD OF INVENTION

The present invention relates to a data strobe signal (DQS) generating circuit in which a data strobe signal is generated in synchronization with an external device in a read/write operation of a semiconductor memory device; and, more particularly, to a data strobe signal generating circuit that is capable of guaranteeing a read DQS preamble time (tRPRE), which is a margin where the data strobe signal generating circuit is driven earlier than an output timing of data stored in a memory cell in a read operation of a semiconductor memory device.

DESCRIPTION OF PRIOR ART

FIG. 1 is a waveform of a clock CLK, a CAS pulse CASB and a data strobe signal DQS in a read operation of a conventional semiconductor memory device when a CAS latency is four clocks and a burst length is four. The environment condition required in the waveform of FIG. 1 is that four data must be outputted after four clocks from an input of a read command and a data strobe signal DQS must be driven prior to one clock from the data output timing and must be set from a floating level to a low level. In other words, it must guarantee tRPRE that is a little longer than one clock.

FIG. 2 is a circuit diagram of a conventional data strobe signal generating circuit. Referring to FIG. 2, the conventional data strobe signal generating circuit includes: a strobe output driver 20 configured with a pull-up. MOS transistor DMP and a pull-down MOS transistor DMN; a first latch 30 for latching a logic value inputted to a gate of the pull-up MOS transistor DMP; a second latch 40 for latching a logic value inputted to a gate of the pull-down MOS transistor DMN; a pull-up clock generator 50 for generating a pull-up clock for turning on the pull-up MOS transistor DMP, in which the pull-up clock is inputted to the first latch 30; a pull-down clock generator 60 for generating a pull-down clock for turning on the pull-down MOS transistor DMN, in which the pull-down clock is inputted to the second latch 40; floating controllers 70 and 80 for floating an output terminal of the strobe output driver 20 in response to a data strobe enable signal dqs_enable; and a preamble part 100 for maintaining the second latch 40 to a low level during a predetermined preamble period so as to maintain an output of the strobe output driver 20 to a low level during the predetermined preamble period.

The data strobe enable signal dqs_enable is set to a high level when the data strobe signal DQS is generated in the read operation, that is, when the data strobe signal DQS is generated by the data strobe signal generating circuit. In this case, the floating controllers 70 and 80 allow the output signals of the pull-up clock generator 50 and the pull-down clock generator 60 to be applied to nodes C and B. On the contrary, in the case of a write operation, the data strobe signal is supplied from an outside of the device. At this point, the data strobe enable signal dqs_enable is set to a low level. In this case, the floating controllers 70 and 80 apply a high level to the node B and a low level to the node C. Thus, the pull-up MOS transistor DMP and the pull-down MOS transistor DMN are turned on to thereby float the output of the strobe output driver 20.

As shown in FIG. 3, the conventional data strobe generating circuit uses a preamble signal preamble_en so as to guarantee the preamble period tRPRE. Since at least one operating clock must be guaranteed as the preamble period tRPRE, the preamble signal preamble_en must be enabled earlier than a completion timing of a CAS latency CL by "one clock+α".

At a period where a DLL clock rclk_dll with a leading phase compared with an operating clock for data processing within the device is in a high level, a node A is set to a high level to turn on the pull-down MOS transistor DMN of the data output driver. Thus, the data strobe signal DQS is set to a low level. Thereafter, at a period where the DLL clock rclk_dll is in a high level, the node C is set to a high level to turn on the pull-up MOS transistor DMP of the data output driver. Thus, the data strobe signal DQS is set to a high level.

At this point, since the DLL clock rclk_dll is in a high level at the node B, the pull-down MOS transistor is turned off. Then, if the DLL clock rclk_dll is set to a low level and a falling DLL clock fclk_dll is set to a high level, the pull-down MOS transistor DMN is turned on and the pull-up MOS transistor DMP is turned off, so that the data strobe signal DQS is set to a low level.

After the data strobe signal DQS matched with the burst length BL is outputted by repetition of the above processes, the data strobe enable signal dqs_enable is disabled to a low level to thereby stop an operation of the strobe output driver 20. In this manner, a DQS transmission line is floated.

In FIG. 2, the preamble signal preamble_en and the DLL clock rclk_dll are inputted to an AND gate configured with a NAND gate NAD01 and an inverter IN01 to switch a preamble MOS transistor PMN. Therefore, in order for an accurate operation, an enable period of the preamble signal preamble_en must cover half clock of the DLL clock rclk_dll as shown in FIG. 3. Accordingly, the preamble signal preamble_en is required to design to have margins indicated by (a) and (b).

The enable period of the preamble signal preamble_en is one operating clock as tRPRE and a length of half clock of the DLL clock rclk_dll is ½ operating clock. Therefore, when a length of one operating clock is 4 ns, the margins (a) and (b) can be designed to have about 1 ns. However, if a length of one operating clock is short, for example about 2 ns, the required margin of about 0.5 ns may be insufficient enough to guarantee a stable circuit design. Also, in some cases, a period where the potential of the node A is a high level becomes too long. Thus, in the output of the data strobe pulse, the potentials of the nodes B and C may be collided.

SUMMARY OF INVENTION

It is, therefore, an object of the present invention to provide a data strobe signal generating circuit capable of guaranteeing a stable design.

It is another object of the present invention to provide a data strobe signal generating circuit capable of a sufficient margin of a design even when the frequency of the driving clock increases.

In it a further another object of the present invention to provide a data strobe signal generating circuit capable of supplying a stable data strobe signal with a preamble signal that is shorter than tRPRE.

Also, it is a still further object of the present invention to provide a data strobe signal generating circuit capable of guaranteeing a stable operation of a semiconductor memory even when PVT (processor, operating voltage, operating temperature) changes.

In accordance with an aspect of the present invention, there is provided a data strobe signal generating circuit for generating a preamble signal for guaranteeing a predetermined preamble period, including: a strobe output driver for outputting a data strobe signal to an outside of a semiconductor device so as to indicate synchronization between an external device and data input/output; and a preamble part for maintaining an output of the strobe output driver to a predetermined logic level during a predetermined delay time from an enabling timing of the preamble signal.

The data strobe signal generating circuit can be applied to a DDR SDRAM that outputs data at falling and rising edges of the external operating clock. The DDR SDRAM uses a DLL clock rclk_dll and a falling DLL clock fclk_dll, which are respectively enabled to a high level and a low level at a rising timing and a falling timing of the reference clock. Accordingly, it is apparent to those skilled in the art that the DLL clock rclk_dll and the falling DLL clock fclk_dll can be substituted for the external operating clock or the internal clock in the general RAM.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device having a column address path therein in accordance with the present invention will be described in detail referring to the accompanying drawings.

A data strobe signal generating circuit in accordance with an embodiment of the present invention uses a preamble signal preamble_en so as to guarantee a preamble period tRPRE. Since at least one operating clock must be guaranteed as the preamble period tRPRE, the preamble signal preamble_en must be enabled earlier than a completion timing of a CAS latency CL by "one clock+α". Since a configuration to generate the preamble signal preamble_en is disclosed in Korean Patent Application NO. 10-2002-0017266, filed by the present applicant, a detailed description thereof will be omitted.

Figure 1:
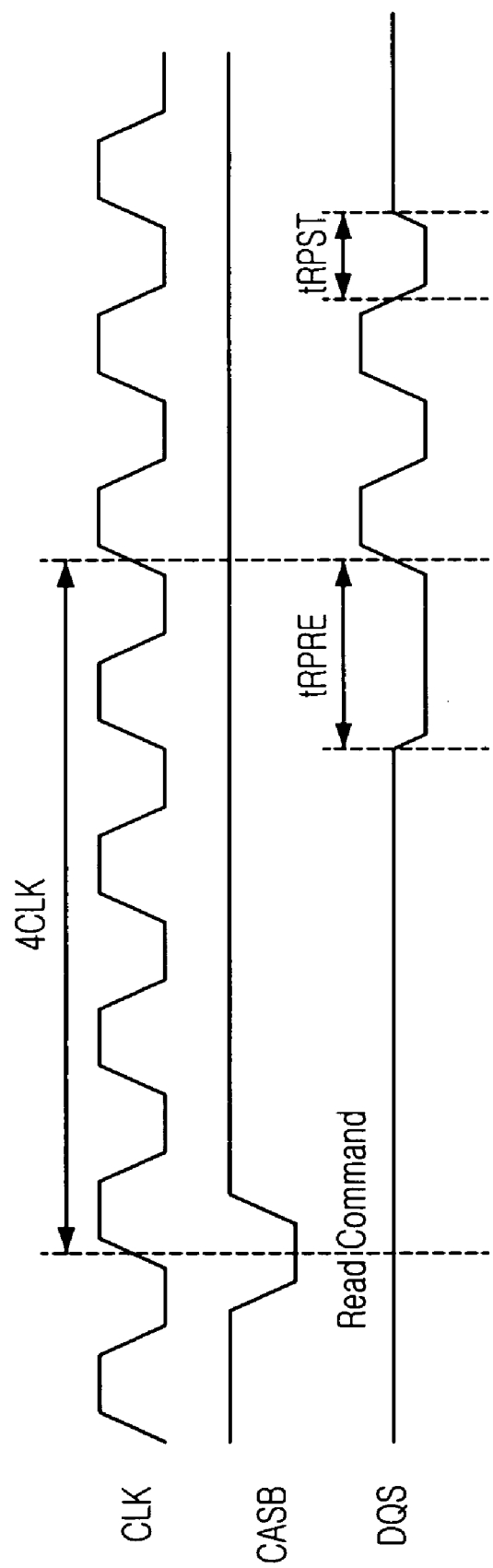
FIG. 1 is a timing diagram illustrating a guaranteeing of a preamble period of a data strobe signal in a semiconductor device.
Figure 2:
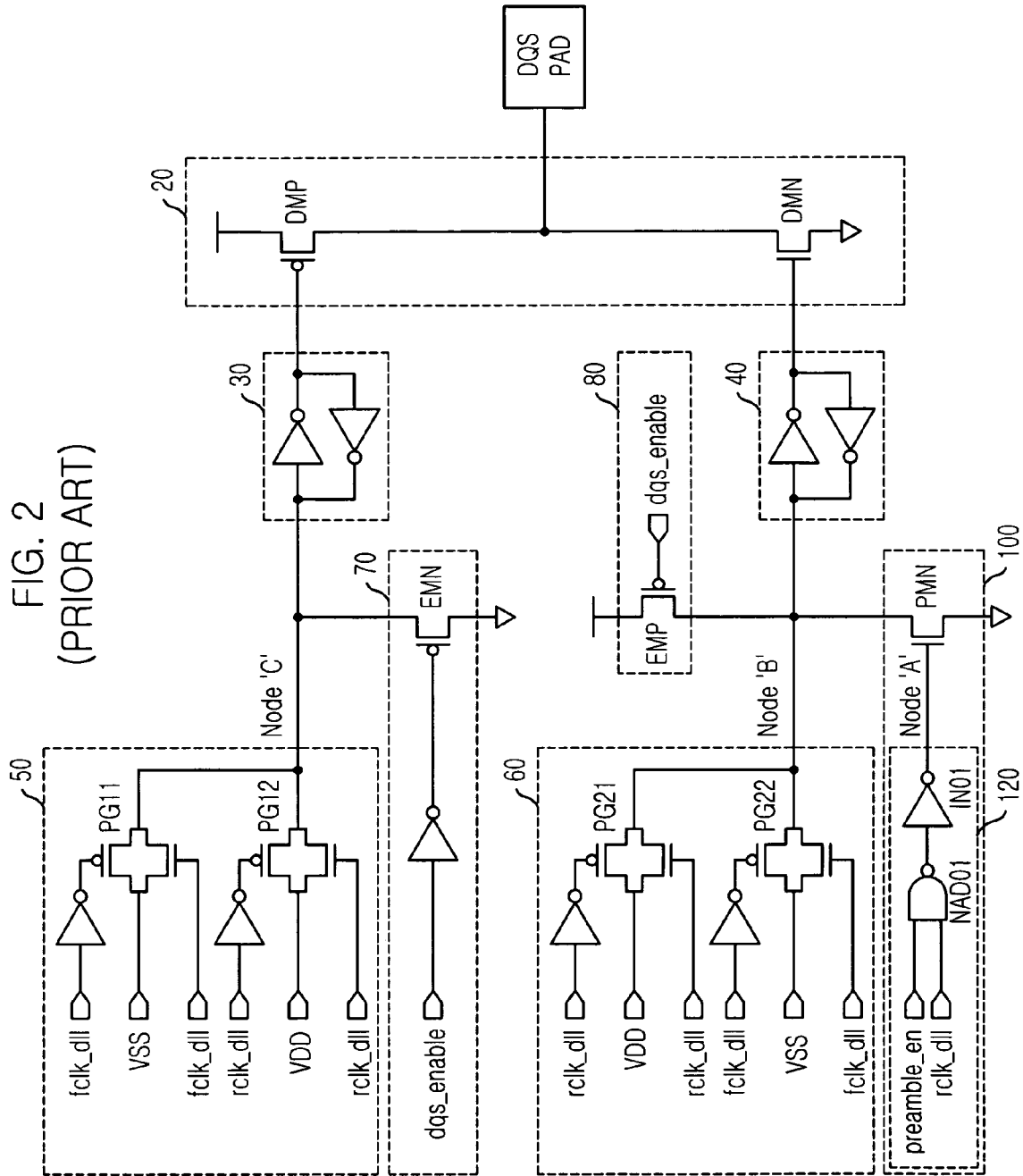
FIG. 2 is a circuit diagram of a conventional data strobe signal generating circuit.
Figure 3:
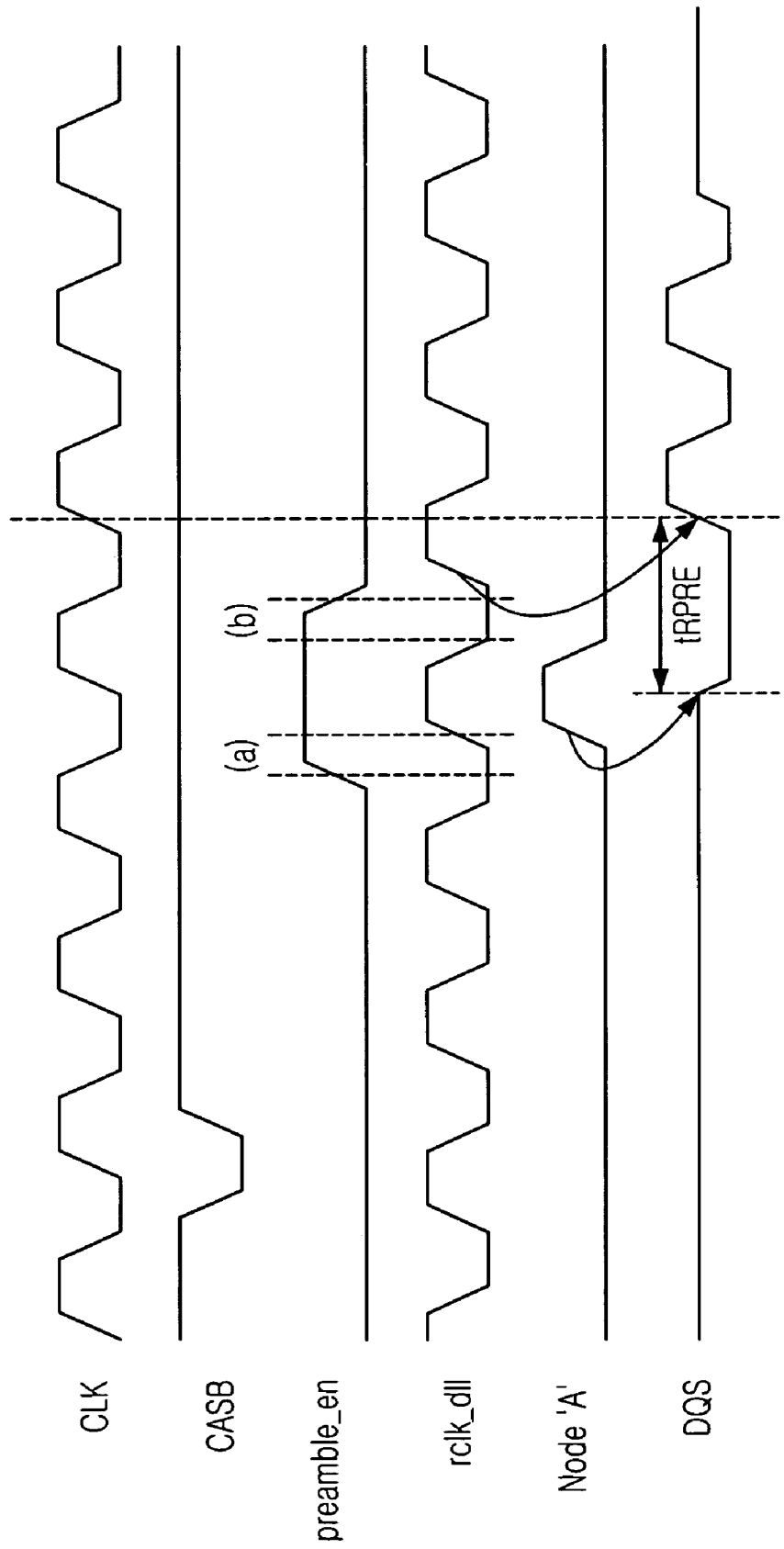
FIG. 3 is a timing diagram of signals generated from the data strobe signal generating circuit shown in FIG. 2.
Figure 4:
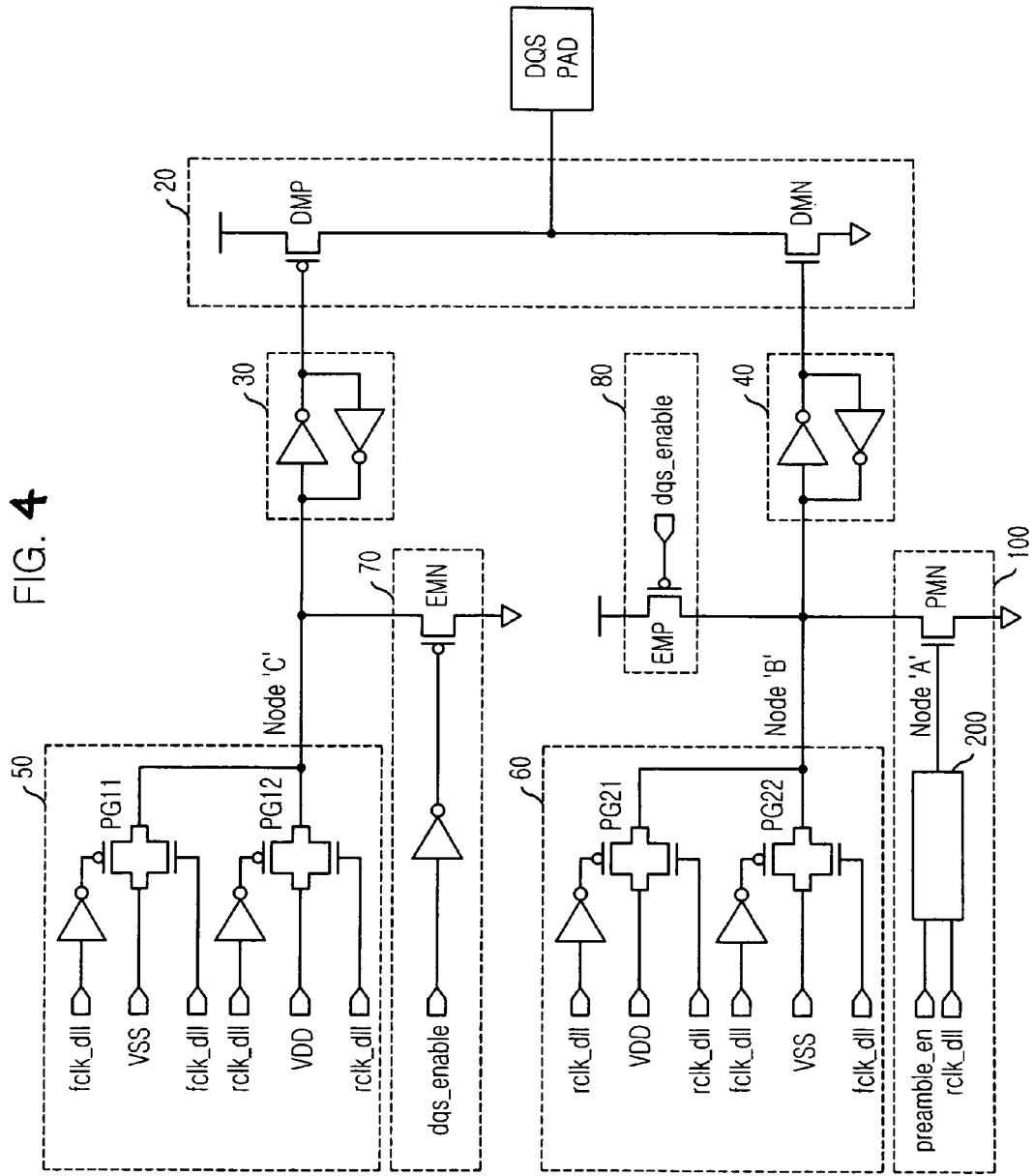
FIG. 4 is a circuit diagram of a data strobe signal generating circuit in accordance with an embodiment of the present invention.

FIG. 4 is a circuit diagram of a data strobe signal generating circuit according to a preferred embodiment of the present invention.

Referring to FIG. 4, the data strobe signal generating circuit includes: a strobe output driver 20 configured with a pull-up MOS transistor DMP and a pull-down MOS transistor DMN; a first latch 30 for latching a logic value inputted to a gate of the pull-up MOS transistor DMP; a second latch 40 for latching a logic value inputted to a gate of the pull-down MOS transistor DMN; a pull-up clock generator 50 for generating a pull-up clock for turning on the pull-up MOS transistor DMP, in which the pull-up clock is inputted to the first latch 30; a pull-down clock generator 60 for generating a pull-down clock for turning on the pull-down MOS transistor DMN, in which the pull-down clock is inputted to the second latch 40; floating controllers 70 and 80 for floating an output terminal of the strobe output driver 20 in response to a data strobe enable signal dqs_enable; and a preamble part 100 for generating a preamble pulse having a short enable period to toggle the second latch 40 at a starting timing of a predetermined preamble period so as to maintain an output of the strobe output driver 20 to a low level during the preamble period.

The output of the strobe output driver 20 is transferred through an external input/output pad (DQS PAD) to an outside of the device. As illustrated in FIG. 4, the first latch 30 for latching the signal to switch the pull-up MOS transistor DMP and the second latch 40 for latching the signal to switch the pull-down MOS transistor DMN can be provided separately. In this case, the floating controllers 70 and 80 must control the first latch 30 and the second latch 40 together. When the data strobe enable signal dqs_enable is in a disabled state, the floating controllers 70 and 80 can be configured with MOS transistors EMN and EMP to set an input terminal of the first latch 30 to a low level and an input terminal of the second latch 40 to a high level.

When a falling DLL clock fclk_dll is in a high level, the pull-up clock generator 50 can be configured to apply a VSS voltage to the input terminal of the first latch 30. Meanwhile, when a DLL clock rclk_dll is in a high level, the pull-up clock generator 50 can be configured to apply a VDD voltage to the input terminal of the first latch 30. On the contrary, when the DLL clock rclk_dll is in a high level, the pull-down clock generator 60 can be configured to apply the VSS voltage to the input terminal of the second latch 40. When the falling DLL clock fclk_dll is in a high level, the pull-down clock generator 60 can be configured to apply the VDD voltage to the input terminal of the second latch 40.

The preamble part 100 includes a preamble MOS transistor PMN acting as a preamble switch to change the input terminal of the second latch 40 to a low level in the preamble, and a preamble controller 200 for controlling a switching operation of the preamble MOS transistor PMN.

Figure 5:
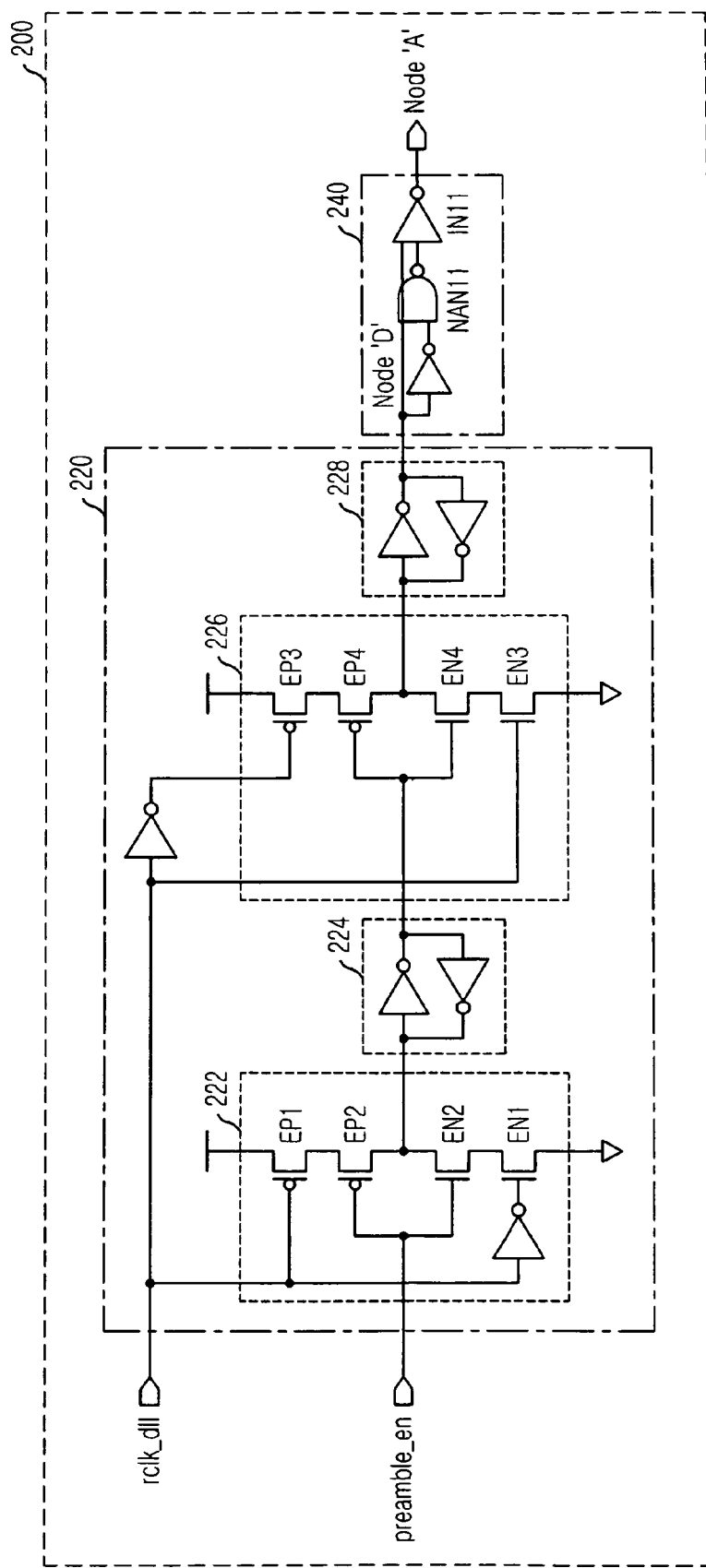
FIG. 5 is a circuit diagram of a preamble controller shown in FIG. 4.

FIG. 5 is a circuit diagram of the preamble controller in accordance with an embodiment of the present invention.

Referring to FIG. 5, the preamble controller 200 includes a rising edge detector 220 and a short pulse generator 240. The rising edge detector 220 detects a rising edge of the preamble signal preamble_en when the DLL clock rclk_dll is in a predetermined logic level. The short pulse generator 240 generates the detecting result of the rising edge detector 220 as a pulse of a short wavelength. The rising edge detector 220 includes: a first switching inverter 222 for inverting the inputted preamble signal preamble_en when the DLL clock rclk_dll is in a low level; a first inverter latch 224 for inverting and latching an output of the first switching inverter 222; a second switching inverter 226 for inverting an output of the first inverter latch 224 when the DLL clock rclk_dll is in a high level; and a second latch 228 for inverting and latching an output of the second switching inverter 226.

When the DLL clock rclk_dll is in a low level, the rising edge detector 220 detects the rising edge of the preamble signal preamble_en and enables a signal of a node D to a high level. When the node D is a rising edge, the short pulse generator 240 generates a short pulse having a short enable period to a node A.

Pass gates can be used as the first switching inverter 222 and the second switching inverter 226. A passing control structure that is responsive to the DLL clock rclk_dll and uses the switching inverters 222 and 226 can be implemented by substituting a NAND gate for one of the inverters constituting the first and second inverter latches 224 and 228.

In another embodiment, the preamble controller 200 includes: a delay unit configured to receive the preamble signal preamble_en; a NOR gate configured to receive an output of the delay unit and an inverted preamble signal; and a switching unit driven only at a high period of the rising pulse. The switching unit can be configured by replacing the inverter of the preamble controller with a NAND gate receiving the rising pulse, or can be configured with a switch to control the power supply (VDD or VSS) according to the rising pulse.

Figure 6:
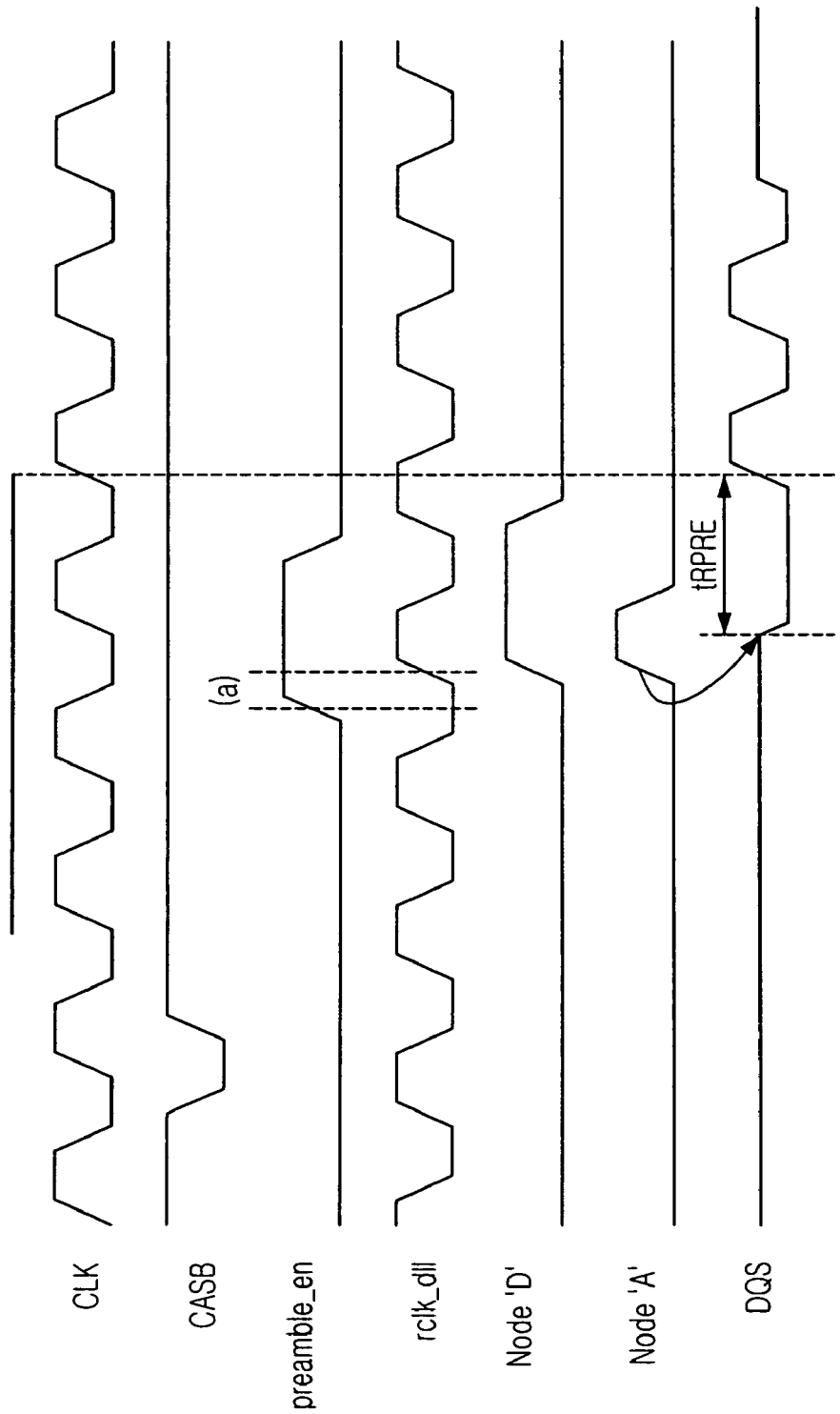
FIG. 6 is a timing diagram of signals generated from the data strobe signal generating circuit shown in FIG. 4.

FIG. 6 is a timing diagram of the signals used in the data strobe signal generating circuit of FIG. 4.

Referring to FIG. 6, the CAS pulse CASB is enabled to a low level in synchronization with the external operating clock CLK, and a DLL circuit (not shown) generates the DLL clock rclk_dll having a leading phase in response to the operating clock CLK. The operating clock CLK is a reference when the memory device inputs/outputs data, and the rising DLL clock rclk_dll is a reference when data is accessed in each memory bank of the memory device. FIG. 6 shows only the data strobe signal DQS generated from the data strobe generating circuit, and a period where the output of the data strobe signal generating circuit is floated is indicated by a middle voltage level.

If the memory device analyzes a set of inputted control signals as a read command, it generates a read command and a CAS pulse CASB that is enabled to a low level. When data read according to the read command is outputted, the data strobe signal generating circuit generates the data strobe signal DQS to an outside (a read data receiving device) in synchronization with the operating clock CLK. Under the condition of CL4 and BL4 in FIG. 5, the data strobe signal DQS must be oscillated after four periods of the external clock from the read command. The data strobe signal DQS of a low level is generated by driving the data strobe signal generating circuit before a period (preamble period) having a little longer than one operating clock prior to the oscillation starting timing of the data strobe signal DQS.

Here, the signal indicating the starting of the preamble period is the preamble signal preamble_en. In order to meet the specification of tRPRE, the preamble signal preamble_en must be enabled earlier than the read data's output timing regulated with the CAS latency CL by "period of one reference clock (CLK)+α". Although not shown, a method for generating the preamble signal preamble_en is to enable the preamble signal preamble_en after a predetermined delay time elapses since the DLL clock fclk_dll becomes a low level from before two operating clocks when the clock count number meets the CAS latency CL. This method can guarantee "one operating clock (CLK)+α" and the margin (a) of FIG. 6. Since a circuit for generating the preamble signal preamble_en is well known, a detailed description thereof will be omitted.

FIG. 6 is a waveform generated in the conditions of CL=4 and BL=4. In FIG. 6, the data strobe signal DQS is oscillated after four reference clocks from the low enabling timing of the CAS pulse CASB. The preamble signal preamble_en is enabled to a high level earlier than an oscillation starting timing of the data strobe signal by "1 operating clock (CLK)+α". The output of the node D is changed to a high level by the rising edge detector 220 of FIG. 4 at the rising timing of the DLL clock after the high enabling of the preamble signal preamble_en. The high transition of the node D causes the short pulse generator to generate a pulse having a short period, so that the waveform of the node A is generated as shown in FIG. 6. A low level is applied to the input terminal of the second latch 40 while the signal of the node A is enabled to a high level. Once the voltage of the node B becomes a low level, the output terminal of the second latch 40 is maintained to a next toggle. Thus, a length of the enabling period of the signal of the node A is sufficient enough to operate the second latch 40. Collision of signals applied to the node B can be prevented, thereby stabilizing the circuit operation.

The rising of the signal of the node A changes the data strobe signal DQS to a low level. If the clock counting that meets the CAS latency CL is completed, the signal dqs_enable is enabled to a high level. Thus, the output signal of the pull-up clock generator 50 shown in FIG. 4 is passed to the first latch 30, and the output signal of the pull-down clock generator 60 is passed to the second latch 40. Accordingly, the pull-up MOS transistor DMP and the pull-down MOS transistor DMN are alternately turned on to oscillate the data strobe signal DQS.

In the data strobe signal generating circuit, only the rising timing of the preamble signal preamble_en must be accurately secured so as to properly guarantee the preamble period tRPRE, but the falling timing of the preamble signal preamble_en need not be accurate. In this embodiment, the data strobe signal DQS is changed to a low level by the short pulse generated at the node A at the rising timing of the preamble signal preamble_en, and the low level is maintained by the latch. Also, as the oscillation of the data strobe signal DQS starts in response to the strobe enable signal dqs_enable, the preamble period tRPRE is finished.

As shown in FIG. 4, the data strobe signal generating method in the data strobe signal generating circuit with the latch for latching the data strobe signal DQS includes the steps of: assigning a CAS latency (S110); generating a read command (S120); performing a count operation with respect to an operating clock in response to the read command (S130); enabling a preamble signal after a predetermined delay time elapses from a timing when the count number reaches (the CAS latency−2) (S140); if the preamble signal is enabled, changing a data strobe signal to a low level (S150); and if the count number reaches the CAS latency, oscillating the data strobe signal in synchronization with the operating clock (S160).

The CAS latency CL is set to positive integers according to the frequency of the external operating clock. Since the process of setting the CAS latency CL and observing it using the counter is well known, a detailed description thereof will be omitted. The read command is generated from a command decoder (not shown) receiving an external command signal.

The strobe signal generating method is provided to guarantee the preamble period of at least one operating clock. It is easy to generate the preamble signal preamble_en for determining the preamble period according to the operating clock. Thus, in the step S140, the enable timing reference of the preamble signal preamble_en is used as a reference where the count number is "the CAS latency−2".

The step S150 includes the steps of: generating a short pulse having a short enable period at an enable edge timing of the preamble signal (S152); and turning on a switch toggling the latch using the short pulse (S154).

In accordance with the present invention, the predetermined preamble period for the data strobe signal can be guaranteed. Also, the rising timing of the preamble signal has only to be reduced so as to guarantee the preamble period, thereby making the stable design easy. Even though the frequency of the driving clock is higher, sufficient design margin can be provided.

That is, it is possible to guarantee the stable operation of the semiconductor memory even when PVT (processor, operating voltage, operating temperature) changes.

While the present invention has been described with respect to the particular embodiments, it will be apparent to those skilled in the art that various changes and modifications may be made without departing from the spirit and scope of the invention as defined in the following claims.

What is claimed is:

1. A data strobe signal generating circuit comprising:
   a strobe output driver for outputting a data strobe signal to an outside of a semiconductor device so as to indicate synchronization between an external device and data input/output;
   a driving latch for latching an output logic level of the strobe output driver in synchronization with an operating clock of the semiconductor device;
   a rising edge detector for detecting a rising edge of a preamble signal when the operating clock is in a predetermined logic level and generating a detected signal;
   a delay unit for delaying the detected signal by a predetermined time;
   a short pulse generator for generating a short pulse by receiving an output of the delay unit and the detected signal; and
   a preamble switch for changing a voltage of one input terminal of the driving latch to a predetermined logic level in response to the short pulse.

2. The data strobe signal generating circuit as recited in claim 1, wherein the strobe output driver includes:
   a pull-up MOS transistor for driving the data strobe signal of a high level; and
   a pull-down MOS transistor for driving the data strobe signal of a low level.

3. The data strobe signal generating circuit as recited in claim 2, wherein the driving latch includes:
   a first latch configured to output a latched signal to a gate of the pull-up MOS transistor; and
   a second latch configured to output a latched signal to a gate of the pull-down MOS transistor.

4. The data strobe signal generating circuit as recited in claim 3, further comprising:
   a pull-up clock generator for toggling a voltage of an input terminal of the first latch according to a transition of the operating clock; and
   a pull-down clock generator for toggling a voltage of an input terminal of the second latch according to the transition of the operation clock.

5. The data strobe signal generating circuit as recited in claim 1, wherein the rising edge detector includes:
   a first switching inverter for inverting the inputted preamble signal when the operating clock is in a first logic level; and
   a first inverter latch for inverting and latching an output of the first switching inverter;
   a second switching inverter for inverting an output of the first inverter latch when the operating clock is in a second logic level; and
   a second latch for inverting and latching an output of the second switching inverter.

6. The data strobe signal generating circuit as recited in claim 1, wherein the short pulse generator includes:
   a logic NAND gate configured to receive the output of the delay unit and the detected signal; and
   an inverter configured to receive an output of the logic NAND gate.

7. The data strobe signal generating circuit as recited in claim 2, further comprising a floating controller for turning off the pull-up MOS transistor and the pull-down MOS transistor according to an instruction of the semiconductor device.

8. The data strobe signal generating circuit as recited in claim 1, wherein the operating clock is a DLL clock that is generated within the semiconductor device and has a leading phase than an external clock in order for synchronization between the external device and the data input/output.

9. A data strobe signal generating method, comprising the steps of:
   a) assigning a CAS latency;
   b) generating a read command;
   c) performing a count operation with respect to an operating clock in response to the read command;
   d) enabling a preamble signal after a predetermined delay time elapses from a timing when the count number reaches (the CAS latency−2);
   e) detecting a rising edge of the preamble signal to provide a detected signal, delaying the detected signal to generate a short pulse having a short enable period, and changing a data strobe signal in response to the short pulse; and
   f) if the count number reaches the CAS latency, oscillating the data strobe signal in synchronization with the operating clock.

10. The data strobe generating method as recited in claim 9, wherein the steps a) to f) are performed within a semiconductor device including a strobe signal generating circuit with a latch for latching a signal to be outputted, and the step e) includes the step of
   turning on a switch toggling the latch using the short pulse.

11. The data strobe generating method as recited in claim 9, wherein the preamble signal is enabled after a predetermined delay time elapses since a DLL clock becomes a predetermined logic level from a timing when the count number reaches (the CAS latency−2).

12. The data strobe generating method as recited in claim 11, wherein an enable period of the preamble signal covers half clock of the DLL clock.

13. The data strobe generating circuit as recited in claim 1, wherein the preamble signal is enabled by delaying a DLL clock for a predetermined delay time.

14. The data strobe generating circuit as recited in claim 13, wherein an enable period of the preamble signal covers half clock of the DLL clock.

* * * * *